United States Patent
Kim et al.

(10) Patent No.: US 12,245,487 B2
(45) Date of Patent: Mar. 4, 2025

(54) DISPLAY PANEL AND METHOD FOR FABRICATING THE SAME

(71) Applicant: Samsung Display Co., Ltd., Yongin-si (KR)

(72) Inventors: Youngmin Kim, Anyang-si (KR); Shin Tack Kang, Yongin-si (KR); Yujin Kim, Hwaseong-si (KR); Haeil Park, Seoul (KR); Hajin Song, Hwaseong-si (KR); Kap Soo Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 401 days.

(21) Appl. No.: 17/672,628

(22) Filed: Feb. 15, 2022

(65) Prior Publication Data

US 2022/0399404 A1  Dec. 15, 2022

(30) Foreign Application Priority Data

Jun. 14, 2021  (KR) .................. 10-2021-0076682

(51) Int. Cl.
*H01L 27/14* (2006.01)
*H10K 50/854* (2023.01)
(Continued)

(52) U.S. Cl.
CPC ........... *H10K 59/38* (2023.02); *H10K 50/854* (2023.02); *H10K 50/865* (2023.02);
(Continued)

(58) Field of Classification Search
CPC .... H10K 59/38; H10K 50/854; H10K 50/865; H10K 59/126; H10K 71/00;
(Continued)

(56) References Cited

U.S. PATENT DOCUMENTS 10,364,391 B2   7/2019  Jang et al.
11,469,287 B2  10/2022  Lee et al.
(Continued)

FOREIGN PATENT DOCUMENTS

EP       3734664 A1    11/2020
KR    10-2168045 B1     7/2015
(Continued)

OTHER PUBLICATIONS

EPO Extended European Search Report dated Nov. 21, 2022, issued in corresponding European Patent Application No. 22178764.1 (6 pages).

*Primary Examiner* — Tan N Tran
(74) *Attorney, Agent, or Firm* — Womble Bond Dickinson (US) LLP

(57) ABSTRACT

A display panel includes: a window including a display area, and a non-display area adjacent to the display area; a color filter layer on the window; a circuit element layer including: a low refractive index layer covering the color filter layer; and a transistor on the low refractive index layer; a light control layer including: division partition walls on the circuit element layer; and a light control pattern between the division partition walls, and including quantum dots; and a display element layer on the light control layer, and including: a first electrode; a second electrode on the first electrode; and an emission layer between the first electrode and the second electrode and to generate light. The light passes through the light control layer, the circuit element layer, and the color filter layer to be transmitted to the window.

19 Claims, 13 Drawing Sheets

(51) Int. Cl.
　　　*H10K 50/86*　　　(2023.01)
　　　*H10K 59/126*　　(2023.01)
　　　*H10K 59/38*　　　(2023.01)
　　　*H10K 71/00*　　　(2023.01)
　　　*H10K 59/12*　　　(2023.01)
　　　*H10K 59/122*　　(2023.01)
　　　*H10K 102/00*　　(2023.01)

(52) U.S. Cl.
　　　CPC ............ *H10K 59/126* (2023.02); *H10K 71/00* (2023.02); *H10K 59/1201* (2023.02); *H10K 59/122* (2023.02); *H10K 2102/331* (2023.02)

(58) Field of Classification Search
　　　CPC ............ H10K 59/1201; H10K 59/122; H10K 2102/331; H10K 59/873; H10K 59/877; H10K 59/8792; H10K 59/879; H10K 59/121; H10K 59/131
　　　USPC ...................................................... 257/59, 72
　　　See application file for complete search history.

(56) References Cited

U.S. PATENT DOCUMENTS

| | | | |
|---|---|---|---|
| 11,469,403 | B2 | 10/2022 | Joo et al. |
| 11,751,420 | B2* | 9/2023 | Ahn .................. H10K 59/8723 257/79 |
| 2002/0024051 | A1 | 2/2002 | Yamazaki et al. |
| 2005/0067945 | A1 | 3/2005 | Nishikawa et al. |
| 2011/0204771 | A1 | 8/2011 | Lee et al. |
| 2019/0163016 | A1 | 5/2019 | Kim et al. |
| 2020/0217998 | A1 | 7/2020 | Jung et al. |
| 2021/0111363 | A1* | 4/2021 | Hwang .................. H10K 71/00 |

FOREIGN PATENT DOCUMENTS

| | | |
|---|---|---|
| KR | 10-2019-0061744 A | 6/2019 |
| KR | 10-2020-0082346 A | 7/2020 |
| KR | 10-2020-0133086 A | 11/2020 |
| KR | 10-2020-0140966 A | 12/2020 |
| WO | 2020/015173 A1 | 1/2020 |

* cited by examiner

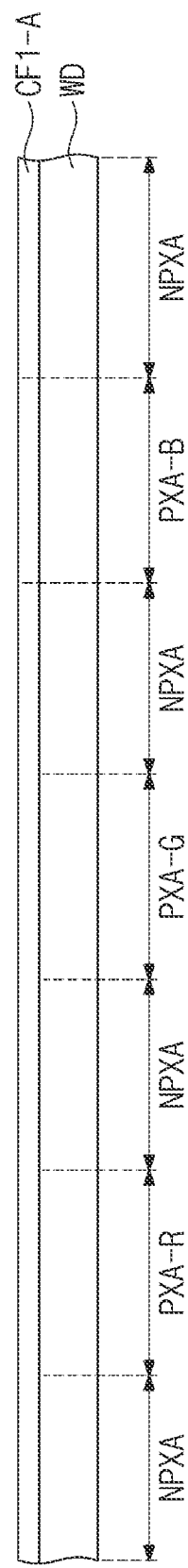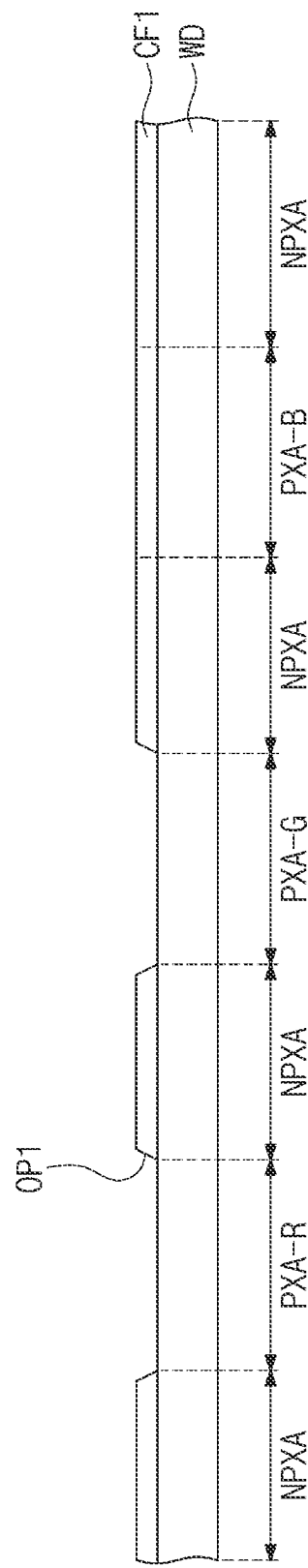

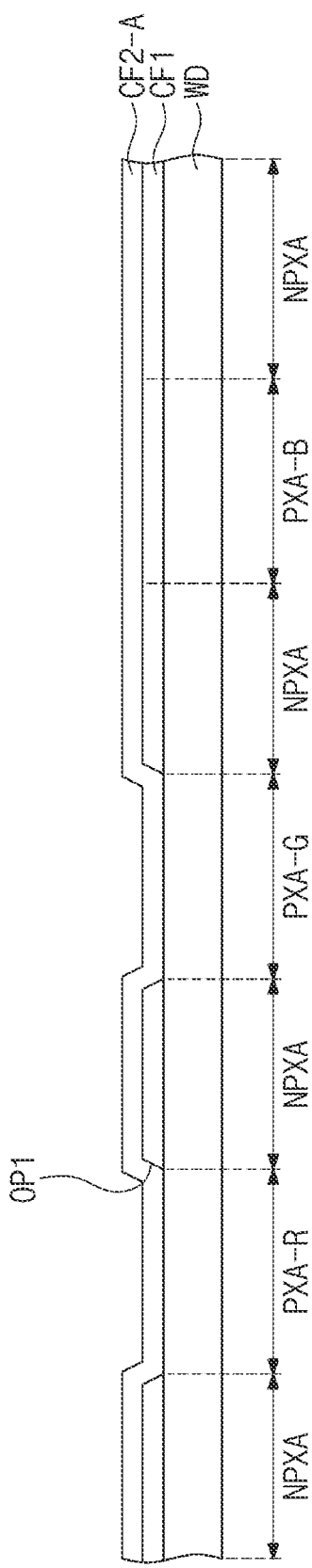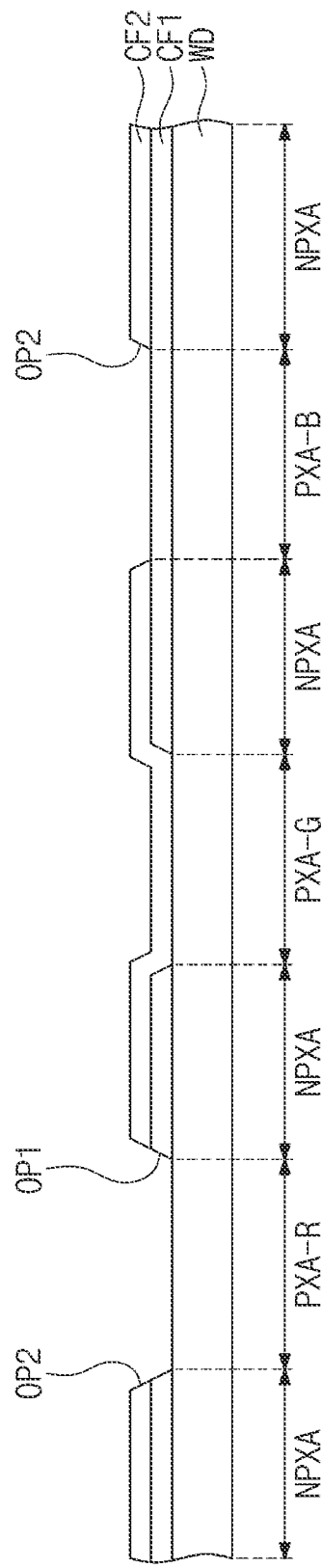

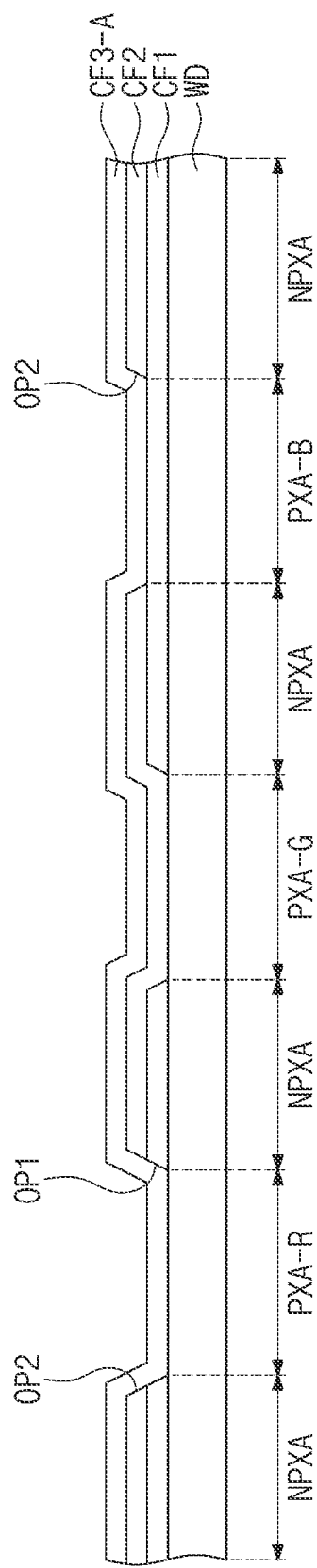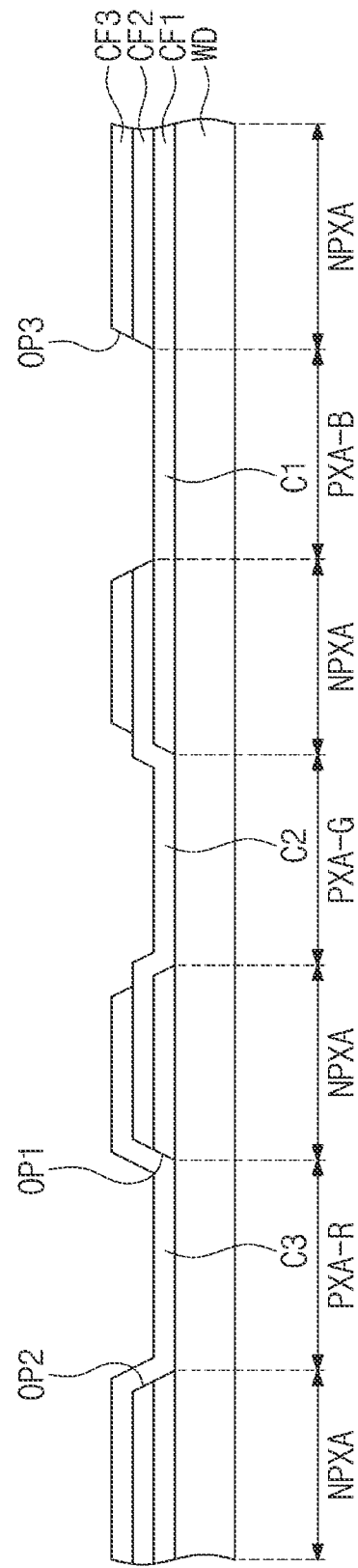

DISPLAY PANEL AND METHOD FOR FABRICATING THE SAME

CROSS-REFERENCE TO RELATED APPLICATION

This application claims priority to and the benefit of Korean Patent Application No. 10-2021-0076682, filed on Jun. 14, 2021, the entire content of which is hereby incorporated by reference.

BACKGROUND

Aspects of embodiments of the present disclosure herein relate to a display panel, and more particularly, to a display panel including a light control pattern and a method for fabricating the same.

A display panel includes a transmissive display panel that selectively transmits source light generated from a light source, and an emissive display panel that generates source light from the display panel itself. The display panel may include different kinds of light control patterns according to pixels to generate a color image. The light control pattern may transmit only a portion of a wavelength range of the source light, or may convert a color of the source light. A portion of the light control pattern may not convert the color of the source light, but may convert characteristics of the light.

The above information disclosed in this Background section is for enhancement of understanding of the background of the present disclosure, and therefore, it may contain information that does not constitute prior art.

SUMMARY

One or more embodiments of the present disclosure are directed to a display panel having high resolution, and a method for fabricating the same.

According to one or more embodiments of the present disclosure, a display panel includes: a window including a display area, and a non-display area adjacent to the display area; a color filter layer on the window; a circuit element layer including: a low refractive index layer covering the color filter layer; and a transistor on the low refractive index layer; a light control layer including: division partition walls on the circuit element layer; and a light control pattern between the division partition walls, and including quantum dots; and a display element layer on the light control layer, and including: a first electrode; a second electrode on the first electrode; and an emission layer between the first electrode and the second electrode and configured to generate light. The light passes through the light control layer, the circuit element layer, and the color filter layer to be transmitted to the window.

In an embodiment, the color filter layer may include first to third filter layers sequentially located on the window and configured to transmit different color light from each other; one of the first to third filter layers may overlap with the light control pattern; and at least two of the first to third filter layers may overlap with the non-display area adjacent to the light control pattern.

In an embodiment, a thickness of the low refractive index layer at an area overlapping with the light control pattern may be greater than a thickness of the low refractive index layer at other areas.

In an embodiment, the transistor may include: a semiconductor pattern including a source, an active, and a drain; and a gate overlapping with the active, and the semiconductor pattern may not overlap with the light control pattern.

In an embodiment, the circuit element layer may include: a passivation layer on the low refractive index layer; a light blocking pattern on the passivation layer; a buffer layer configured to cover the light blocking pattern, and on which the semiconductor pattern is located; an intervening insulating layer between the active and the gate; an intermediate insulating layer configured to cover the gate and the buffer layer; a connection electrode on the intermediate insulating layer to connect the source to the first electrode; and a cover insulating layer configured to cover the connection electrode.

In an embodiment, the light blocking pattern may overlap with at least a portion of the semiconductor pattern, and may be spaced from the light control pattern.

In an embodiment, the connection electrode may pass through the buffer layer to be connected to the light blocking pattern.

In an embodiment, the circuit element layer may include a capacitor including: a first capacitor electrode on the intervening insulating layer; and a second capacitor electrode overlapping with the first capacitor electrode on the intervening insulating layer.

In an embodiment, the display panel may further include a pad on the intermediate insulating layer at the non-display area, and exposed by the cover insulating layer, and the pad may include the same material as that of the connection electrode.

In an embodiment, the display element layer may include a pixel defining layer having a display opening overlapping with the light control pattern.

In an embodiment, the display panel may further include a dam part on the circuit element layer at the non-display area, and the dam part may include the same material as that of at least one of the division partition walls or the pixel defining layer.

In an embodiment, the display element layer may further include an encapsulation layer configured to cover a light emitting element.

In an embodiment, the emission layer may be configured to generate blue light.

In an embodiment, the display panel may be curved along an axis extending in one direction.

According to one or more embodiments of the present disclosure, a display panel includes: a window including emission areas, and non-emission areas adjacent to the emission areas; a color filter layer on the window, and including first to third filter layers configured to transmit different color light from each other; transistors on the color filter layer; a light control layer overlapping with corresponding ones of the first to third filter layers, and including first to third light control patterns, at least one of the first to third light control patterns including quantum dots; and light emitting elements connected to corresponding ones of the transistors, and configured to generate light. A corresponding one of the first to third filter layers is located on the window to overlap with a corresponding one of the emission areas, and each of the first to third filter layers are located on the window to overlap with the non-emission areas.

In an embodiment, the first to third filter layers may be sequentially laminated on the window, and the first filter layer may be configured to transmit blue light, the second filter layer may be configured to transmit green light, and the third filter layer may be configured to transmit red light.

In an embodiment, the display panel may further include a low refractive index layer configured to cover the color filter layer, and the transistors may be spaced from the first to third filter layers with the low refractive index layer therebetween.

In an embodiment, a thickness of the low refractive index layer at each area overlapping with the emission areas is greater than a thickness of the low refractive index layer at each area overlapping with the non-emission areas.

In an embodiment, the display panel may further include division partition walls configured to partition the first to third light control patterns from each other, and the division partition walls may overlap with the non-emission areas.

In an embodiment, each of the light emitting elements may include a first electrode, a second electrode, and an emission layer between the first electrode and the second electrode, and at least one of the emission layer or the second electrode may be included in each of the light emitting elements as one pattern connected to each other.

In an embodiment, the light generated from the light emitting elements may include blue light.

In an embodiment, the light may pass through the light control layer and the color filter layer to be transmitted to the window.

According to one or more embodiments of the present disclosure, a method for fabricating a display panel, includes: forming a color filter layer on a window; forming a low refractive index layer covering the color filter layer, and a passivation layer covering the low refractive index layer; forming a light blocking pattern on the passivation layer, and a circuit element layer comprising a transistor connected to the light blocking pattern; forming division partition walls on the circuit element layer; forming light control patterns between the division partition walls, at least one of the light control patterns comprising quantum dots; and forming a light emitting element on the light control pattern and connected to the transistor.

In an embodiment, the forming of the color filter layer may include: forming a first opening in a first filter layer after forming the first filter layer on the window; forming a second opening in a second filter layer after forming the second filter layer on the first filter layer; and forming a third opening in a third filter layer after forming the third filter layer on the second filter layer.

In an embodiment, the color filter layer may include first to third filter layers; openings may be formed in only two filter layers from among the first to third filter layers at an area overlapping with a corresponding one of the light control patterns; and a remaining one filter layer from among the first to third filter layers may be disposed in the openings of the two filter layers, and may be in contact with the window.

In an embodiment, the forming of the color filter layer, the forming of the low refractive index layer and an additional refractive index layer, the forming of the circuit element layer, the forming of the light control patterns, and the forming of the light emitting element may be performed through a continuous process.

BRIEF DESCRIPTION OF THE FIGURES

The above and other aspects and features of the present disclosure will be more clearly understood from the following detailed description of the illustrative, non-limiting embodiments with reference to the accompanying drawings. In the drawings:

FIG. 6A is a cross-sectional view illustrating a method for fabricating a display panel according to an embodiment of the present disclosure;

FIG. 6B is a cross-sectional view illustrating a method for fabricating a display panel according to an embodiment of the present disclosure;

FIG. 6C is a cross-sectional view illustrating a method for fabricating a display panel according to an embodiment of the present disclosure;

FIG. 6D is a cross-sectional view illustrating a method for fabricating a display panel according to an embodiment of the present disclosure;

FIG. 6E is a cross-sectional view illustrating a method for fabricating a display panel according to an embodiment of the present disclosure;

FIG. 6F is a cross-sectional view illustrating a method for fabricating a display panel according to an embodiment of the present disclosure;

DETAILED DESCRIPTION

Figure 1A:
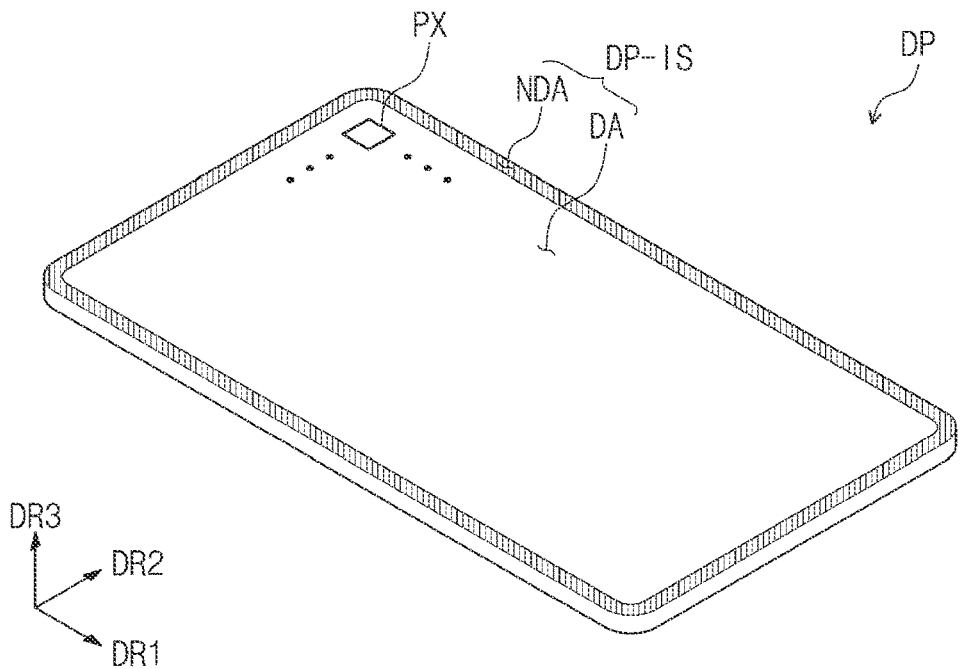
FIG. 1A is a perspective view of a display panel according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, ratios, and dimensions of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. These terms may be a relative concept, and described based on the directions expressed in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, a first direction DR1, a second direction DR2, and a third direction DR3 are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
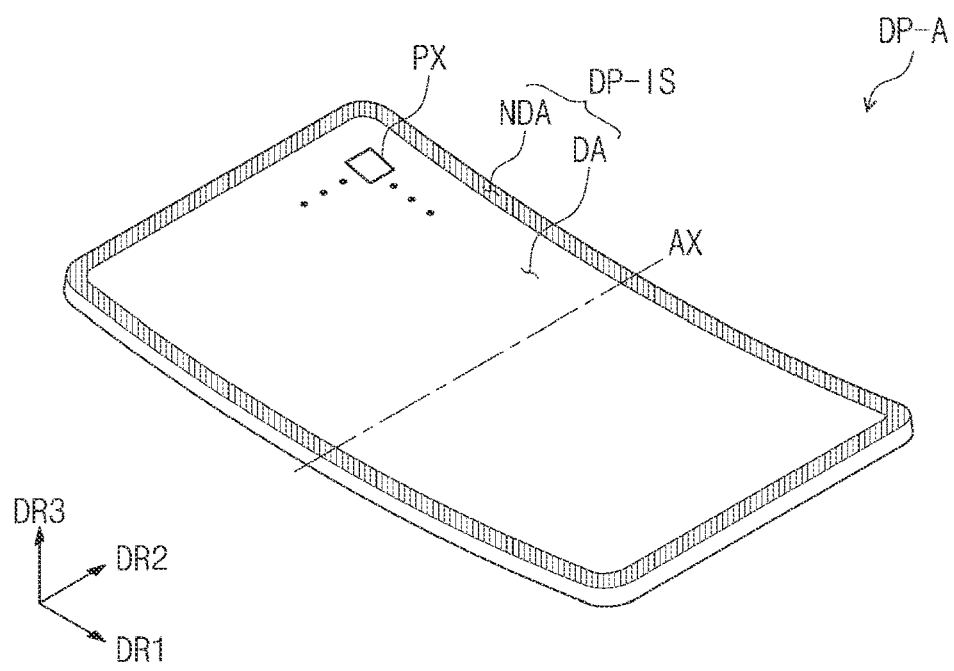
FIG. 1B is a perspective view of a curved display panel according to an embodiment of the present disclosure.
Figure 1C:
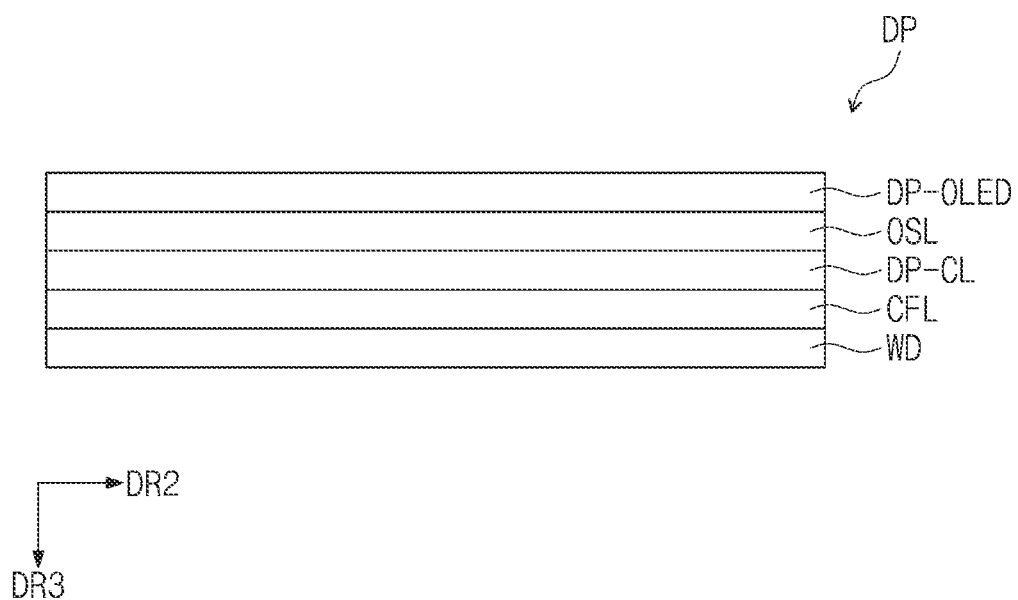
FIG. 1C is a cross-sectional view of the display panel according to an embodiment of the present disclosure.
Figure 1D:
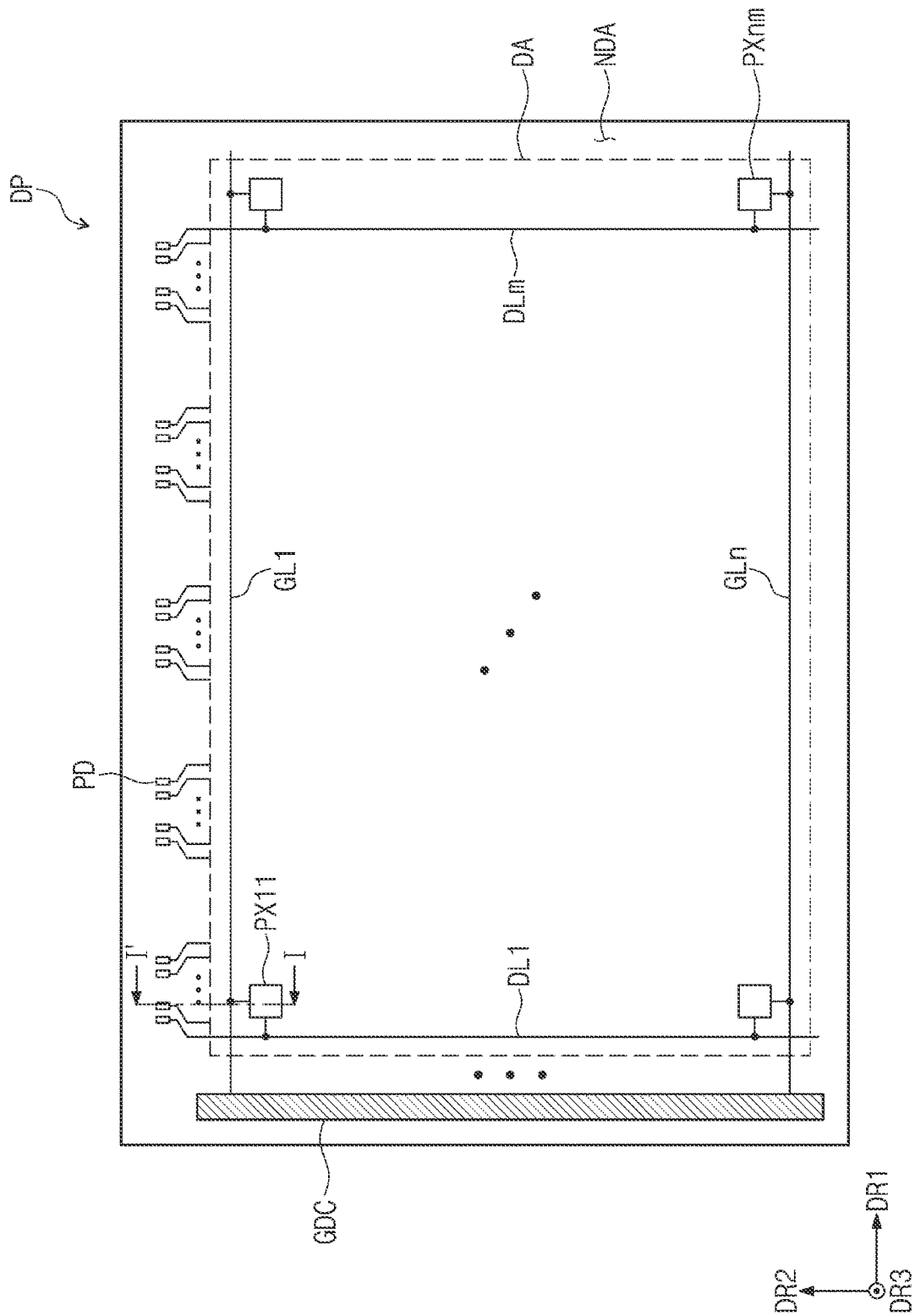
FIG. 1D is a plan view of the display panel according to an embodiment of the present disclosure.
Figure 2:
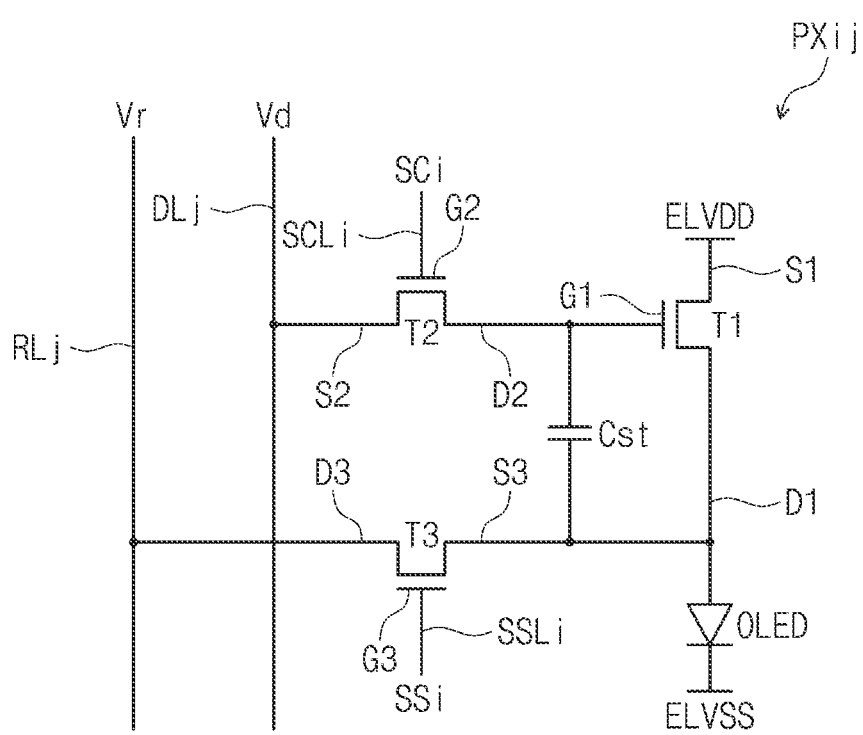
FIG. 2 is an equivalent circuit diagram of a pixel according to an embodiment of the present disclosure.

FIG. 1A is a perspective view of a display panel according to an embodiment of the present disclosure. FIG. 1B is a perspective view of a curved display panel according to an embodiment of the present disclosure. FIG. 1C is a cross-sectional view of the display panel according to an embodiment of the present disclosure. FIG. 1D is a plan view of the display panel according to an embodiment of the present disclosure. FIG. 2 is an equivalent circuit diagram of a pixel according to an embodiment of the present disclosure.

Each of the display panels DP and DP-A illustrated in FIGS. 1A and 1B may be an emissive display panel, and may include one of a liquid crystal display panel, an electrophoretic display panel, a microelectromechanical system display panel (MEMS), an electrowetting display panel, an organic light emitting display panel, and an inorganic light emitting display panel, but the present disclosure is not particularly limited.

As illustrated in FIG. 1A, the display panel DP may display an image through a display surface DP-IS. The display surface DP-IS may be parallel to or substantially parallel to a surface defined by a first direction DR1 and a second direction DR2. A top surface of a member disposed at an uppermost side of the display panel DP may be defined as the display surface DP-IS. According to an embodiment of the present disclosure, a top surface of a window WD (e.g., see FIG. 1C) may be defined as the display surface DP-IS of the display panel DP.

The display surface DP-IS may be parallel to or substantially parallel to the surface defined by the first direction DR1 and the second direction DR2. A normal direction of the display surface DP-IS (e.g., a thickness direction of the display panel DP) may be indicated as a third direction DR3. A front surface (or a top surface) and a rear surface (or a bottom surface) of each layer or unit, which will be described in more detail below, are distinguished from each other by the third direction DR3.

The display panel DP may include a display area DA and a non-display area NDA. A pixel PX is disposed at (e.g., in or on) the display area DA, and no pixels PX may be disposed at (e.g., in or on) the non-display area NDA. The non-display area NDA is defined along an edge of the display surface DP-IS. The non-display area NDA may surround (e.g., around a periphery of) the display area DA. In an embodiment of the present disclosure, the non-display area NDA may be omitted, or may be disposed at only one side, two sides, or more of the display area DA.

Although the display panel DP having a planar or substantially planar display surface DP-IS is illustrated in the embodiment shown in FIG. 1, the present disclosure is not limited thereto. In other embodiments, the display panel DP may include a curved display surface or a solid display surface. The solid display surface may include a plurality of display areas that indicate different directions.

For example, referring to FIG. 1B, the display panel DP-A according to an embodiment may be curved along the first direction DR1 with respect to a virtual axis AX extending in the second direction DR2. However, the present disclosure is not limited thereto, and the virtual axis AX may extend in the first direction DR1, or the display panel DP-A may be curved based on a plurality of virtual axes extending in different directions.

Also, the display panel may be a rollable display panel, a foldable display panel, and/or a slidable display panel. The display panel may have a flexible property, and may be folded and/or rolled after being installed in the display device.

Referring to FIG. 1C, the display panel DP according to an embodiment of the present disclosure may include a window WD, a color filter layer CFL disposed on the window WD, a circuit element layer DP-CL disposed on the color filter layer CFL, a light control layer OSL disposed on the circuit element layer DP-CL, and a display element layer DP-OLED disposed on the light control layer OSL.

In an embodiment of the present disclosure, the window WD may be a base layer that may be formed by depositing and patterning components of the display panel DP. The window WD may include an optically transparent insulating material. For example, the window WD may include a glass substrate or a synthetic resin film.

The color filter layer CFL may be disposed on the window WD. The color filter layer CFL may include a plurality of filter layers. Each of the filter layers transmits light in a corresponding or suitable wavelength range (e.g., a predetermined or specific wavelength range), and blocks light in other wavelength ranges except for the light having the corresponding wavelength range. Thus, light passing through the light control layer OSL may be selectively transmitted through the window WD by the color filter layer CFL.

The circuit element layer DP-CL may be disposed on the color filter layer CFL. The circuit element layer DP-CL includes a driving circuit and/or a signal line of the pixel PX.

The light control layer OSL may be disposed on the circuit element layer DP-CL. The light control layer OSL may include light control patterns capable of changing optical properties of the source light provided from a light emitting element. In one or more embodiments of the present disclosure, the light control patterns may include quantum dots.

The display element layer DP-OLED may be disposed on the light control layer OSL. The display element layer DP-OLED may include a light emitting element disposed in each pixel PX, and an encapsulation layer sealing the light emitting element.

According to an embodiment of the present disclosure, the laminating order of the window WD, the color filter layer CFL, the circuit element layer DP-CL, the light control layer OSL, and the display element layer DP-OLED may be opposite to a direction in which light generated by the display element layer DP-OLED passes (e.g., is transmitted) through the window WD. In other words, the lower surface of the window WD shown in FIG. 1C may correspond to the top surface of the window WD that defines the display surface DP-IS of the display panel DP as described above.

Referring to FIG. 1D, an arrangement relationship between signal lines GL1 to GLn and DL1 to DLm and pixels PX11 to PXnm in a plan view (e.g., on a plane) is illustrated. The signal lines GL1 to GLn and DL1 to DLm may include a plurality of gate lines GL1 to GLn, and a plurality of data lines DL1 to DLm, where n and m are natural numbers greater than 1.

Each of the pixels PX11 to PXnm are connected to one or more corresponding gate lines of the plurality of gate lines GL1 to GLn, and a corresponding data line of the plurality of data lines DL1 to DLm. Each of the pixels PX11 to PXnm may include a pixel driver circuit and a display element. However the present disclosure is not limited thereto, and more kinds (and/or different kinds) of signal lines may be provided at (e.g., in or on) the display panel DP according to a configuration of the pixel driving circuit of the pixels PX11 to PXnm.

In FIG. 1D, the pixels PX11 to PXnm having a form (e.g., an arrangement) of a matrix are illustrated as an example, but the present disclosure is not limited thereto. For example, in other embodiments, the pixels PX11 to PXnm may be arranged in a diamond-shaped arrangement and/or an RGBG kind of arrangement (e.g., in a PENTILE® arrangement, PENTILE® being a duly registered trademark of Samsung Display Co., Ltd.). The gate driver circuit GDC may be integrated with the display panel DP through an oxide silicon gate driver circuit (OSG) process or an amorphous silicon gate driver circuit (ASG) process.

Referring to FIG. 2, a pixel PXij may include a light emitting element OLED, a plurality of transistors T1 to T3, and a capacitor Cst. The plurality of transistors T1 to T3 may be formed through a low-temperature polycrystalline silicon (LTPS) process, or a low-temperature polycrystalline oxide (LTPO) process.

FIG. 2 illustrates the pixel PXij that is connected to i-th first gate lines SCLi and SSLi, a j-th data line DLj, and a j-th reference line RLj as an example, where i and j are natural numbers.

The i-th gate lines SCLi and SSLi may receive i-th gate signals SCi and SSi. The i-th gate signals SCi and SSi may include an i-th write gate signal SCi and an i-th sampling gate signal SSi.

The transistors T1 to T3 may include a driving transistor T1, a first switch transistor T2, and a second switch transistor T3.

The transistors T1 to T3 may be NMOS transistors, but the present disclosure is not limited thereto. For example, the transistors T1 to T3 may be PMOS transistors. Each of the transistors T1 to T3 may include a corresponding source S1, S2, and S3, a corresponding drain D1, D2, and D3, and a corresponding gate G1, G2, and G3.

The light emitting element OLED may be an organic light emitting element including a first electrode (e.g., an anode) and a second electrode (e.g., a cathode). The anode of the light emitting element OLED may receive a first voltage ELVDD through the driving transistor T1, and the cathode of the light emitting element OLED may receive a second voltage ELVSS. The light emitting element OLED may receive the first voltage ELVDD and the second voltage ELVSS to emit light.

The driving transistor T1 may include a source S1 for receiving the first voltage ELVDD, a drain D1 connected to the anode of the light emitting element OLED, and a gate G1 connected to the capacitor Cst.

The first switch transistor T2 includes a source S2 connected to the j-th data line DLj, a drain D2 connected to the capacitor Cst, and a gate G2 for receiving the i-th write gate signal SCi. The j-th data line DLj may receive a data voltage Vd and a data voltage for sensing.

The second switch transistor T3 may include a drain D3 connected to the j-th reference line RLj, a source S3 connected to the anode of the light emitting element OLED, and a gate G3 for receiving the i-th sampling gate signal SSi. The j-th reference line RLj may receive a reference voltage Vr.

The capacitor Cst may be connected to the gate G1 of the driving transistor T1 and the anode of the light emitting element OLED. The capacitor Cst may include a first capacitor electrode connected to the gate G1 of the driving transistor T1, and a second capacitor electrode connected to the anode of the light emitting element OLED.

However, an equivalent circuit of the pixel PXij according to embodiments of the present disclosure is not limited to the equivalent circuit illustrated in FIG. 2. In other embodiments of the present disclosure, the pixel PXij may have various suitable shapes, arrangements, and elements to allow the light emitting element OLED to suitably emit light.

Figure 3:
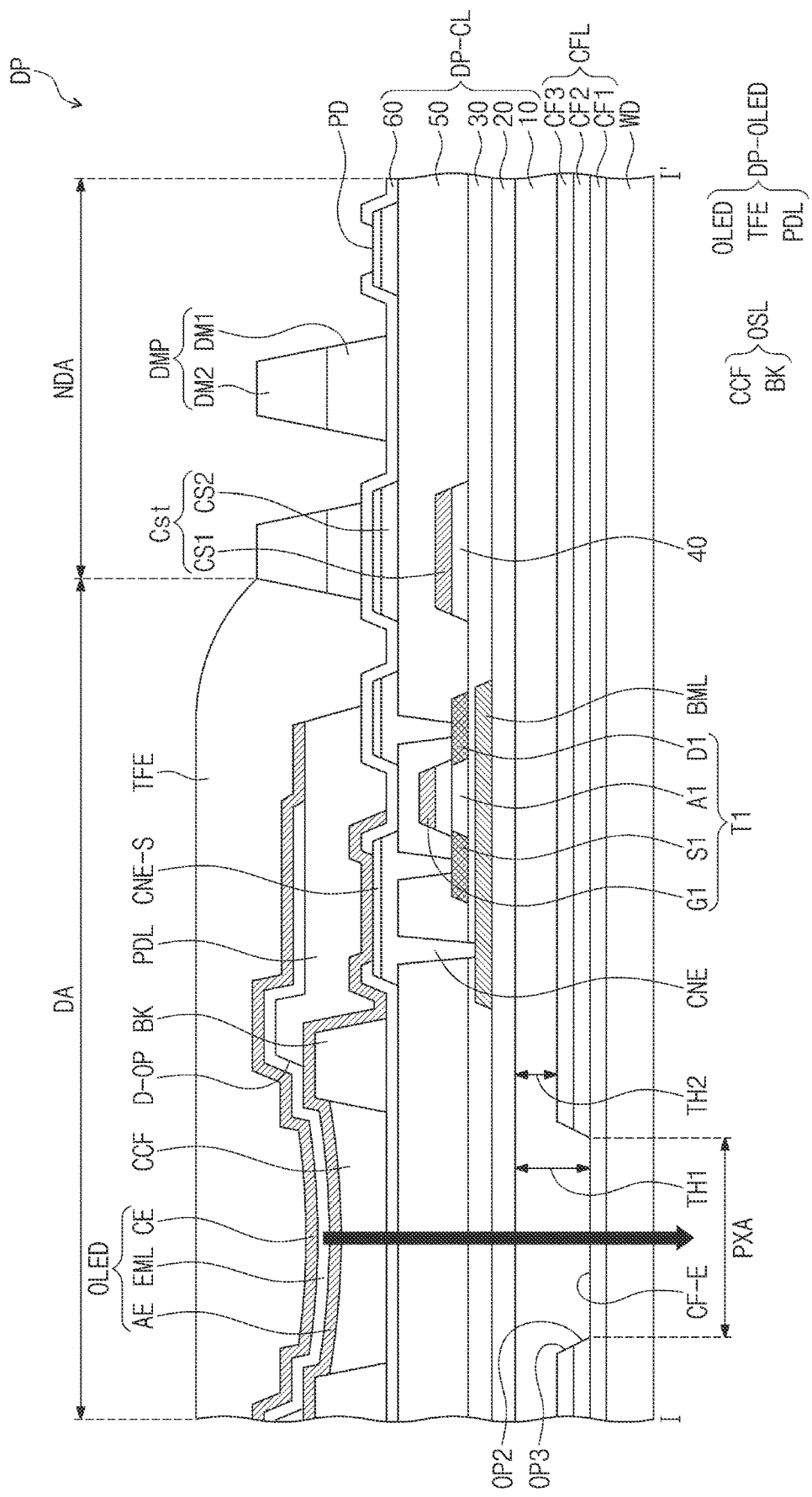
FIG. 3 is a cross-sectional view taken along the line I-I' of FIG. 1D.

FIG. 3 is a cross-sectional view taken along the line I-I' of FIG. 1D.

Referring to FIG. 3, the display panel DP according to an embodiment may include the window WD, the color filter layer CFL, the circuit element layer DP-CL, the light control layer OSL, and the display element layer DP-OLED.

The window WD may include an optically transparent insulating material. For example, the window WD may include a glass substrate or a synthetic resin film.

When the window WD includes the synthetic resin film, the window WD may include a polyimide (PI) film or a polyethylene terephthalate (PET) film.

The window WD may have a single-layer structure or a multilayered structure. For example, the window WD may include a plurality of plastic films bonded to each other by using an adhesive, or may include a glass substrate and a plastic film, which are bonded to each other by using an adhesive. In some embodiments, the window WD may further include a functional layer, for example, such as an anti-fingerprint layer and/or an impact absorption layer.

The color filter layer CFL may be disposed on the window WD. The color filter layer CFL may include first to third filter layers CF1, CF2, and CF3. Each of the first to third filter layers CF1, CF2, and CF3 transmits light having a corresponding or suitable wavelength range (e.g., a predetermined or specific wavelength range), and blocks light in other wavelength ranges except for the light having the corresponding wavelength range.

According to the present embodiment, at (e.g., in or on) an area overlapping with an emission area PXA, the second filter layer CF2 may have a second opening OP2, and the third filter layer CF3 may have a third opening OP3. Accordingly, only the first filter layer CF1 from among the color filter layers CF1, CF2, and CF3 may be disposed on the window WD at (e.g., in or on) the area overlapping with the emission area PXA. In this case, when the first filter layer CF1 transmits blue light and blocks red light and green light, the emission area PXA according to the present embodiment may be an area through which the blue light is transmitted. In FIG. 3, a direction in which light generated from the light emitting element OLED is provided to the window WD is indicated by a bolded arrow.

Thus, at (e.g., in or on) non-emission areas adjacent to the emission area PXA, the first, second, and third color filter layers CF1, CF2, and CF3 may be disposed, and at (e.g., in or on) other emissions areas adjacent to the emission area PXA, only the second filter layer CF2 or the third filter layer CF3 from among the first, second, and third color filter layers CF1, CF2, and CF3 is disposed on the window WD, and thus, the other emission areas through which the red light or the green light is selectively transmitted may be defined.

The circuit element layer DP-CL is disposed on the color filter layer CFL. The circuit element layer DL-CL may include a plurality of insulating layers 10 to 60, a transistor (e.g., T1), a capacitor Cst, and a pad PD. FIG. 3 illustrates the driving transistor T1 from among the transistors T1 to T3 illustrated in FIG. 2 as an example.

In more detail, a low refractive index layer 10 may be disposed on the color filter layer CFL to cover the first to third filter layers CF1, CF2, and CF3. The low refractive index layer 10 may include one of an inorganic material and an organic material. For example, the inorganic material may include at least one of silicon nitride, silicon oxy nitride, or silicon oxide. For example, the organic material may include a silicon-based resin and hollow silica.

The low refractive index layer 10 may be disposed within (e.g., inside) the openings OP2 and OP3 defined at (e.g., in or on) the first to third filter layers CF1, CF2 and CF3 to provide a flat or substantially flat surface. Thus, the low refractive layer 10 at the area overlapping with the emission area PXA and at other areas may have thicknesses that are different from each other.

For example, the low refractive index layer 10 may be disposed in the second and third openings OP2 and OP3 defined at (e.g., in or on) the emission area PXA. Thus, a first thickness TH1 of the low refractive index layer 10 at the area overlapping with the emission area PXA may be greater than a second thickness TH2 of the low refractive index layer 10 at the other areas other than the light emission area PXA.

The low refractive index layer 10 may be in contact with the first filter layer CF1 (e.g., a portion of the first filter layer CF-E) overlapping with the emission area PXA.

A passivation layer 20 may be disposed on the low refractive index layer 10. The passivation layer 20 may include an inorganic material. For example, the passivation layer 20 may include at least one of silicon nitride, silicon oxy nitride, or silicon oxide.

A light blocking pattern BML may be disposed on the passivation layer 20. The light blocking pattern BML may overlap with at least a portion of semiconductor patterns S1, A1, and D1, and may not overlap with the emission area PXA. The light blocking pattern BML may include a metal. For example, the light blocking pattern BML may include molybdenum (Mo).

The light blocking pattern BML may protect the semiconductor patterns S1, A1, and D1 from light incident through the window WD. In other words, as the light blocking pattern BML is disposed under (e.g., underneath) the driving transistor T1, residual-voltage characteristics of the semiconductor patterns S1, A1, and D1 may be prevented or substantially prevented from being degraded by external light. Thus, the display panel DP having improved reliability may be provided.

In addition, even when the light blocking pattern BML is disposed between the light emitting element OLED and the color filter layer CFL, light output efficiency of light generated from the light emitting element OLED may not be reduced or substantially reduced.

The buffer layer 30 may be disposed on the passivation layer 20 to cover the light blocking pattern BML. The buffer layer 30 improves a bonding force between the low refractive index layer 10 and/or the passivation layer 20 and the semiconductor pattern. The buffer layer 30 may include an organic material. For example, the buffer layer 30 may include at least one of silicon oxide or silicon nitride. In some embodiments, in the buffer layer 30, a silicon oxide layer and a silicon nitride layer may be alternately laminated.

The semiconductor patterns S1, A1, and D1 included in the driving transistor T1 may be disposed on the buffer layer 30. An intervening insulating layer 40 may be disposed on an area overlapping with an active A1 from among the semiconductor patterns S1, A1 and D1, and the gate G1 of the driving transistor T1 may be disposed on the intervening insulating layer 40. The intervening insulating layer 40 and the gate G1 may be patterned concurrently (e.g., simultaneously or at the same or substantially the same time). The active A1, the source S1, and the drain D1 may be regions that are divided according to a doping concentration or a conductivity of the semiconductor pattern.

The first capacitor electrode CS1 of the capacitor Cst may be disposed on the intervening insulating layer 40. The first capacitor electrode CS1 and the intervening insulating layer 40 may be patterned concurrently (e.g., simultaneously or at the same or substantially the same time).

An intermediate insulating layer 50 may be disposed on the buffer layer 30 to cover portions of the semiconductor patterns S1, A1, and D1, the gate G1, and the first capacitor electrode CS1. The intermediate insulating layer 50 may include an organic material or an inorganic material.

A connection electrode CNE, a second capacitor electrode CS2, and a pad PD may be disposed on the intermediate insulating layer 50.

One side of the connection electrode CNE may pass through the intermediate insulating layer 50 to be connected to the source S1, and may electrically connect the driving transistor T1 to the first electrode AE of the light emitting element OLED.

In the present embodiment, another side of the connection electrode CNE may pass through the intermediate insulating layer 50 and the buffer layer 30 to be connected to the light blocking pattern BML. Thus, the light blocking pattern BML may receive a signal (e.g., a predetermined signal). However, the present disclosure is not limited thereto, and the connection electrode CNE may be spaced apart from (e.g., may be separated from) the light blocking pattern BML, and thus, the light blocking pattern BML may be in a floated state.

The second capacitor electrode CS2 may be disposed on the intermediate insulating layer 50 to overlap with the first capacitor electrode CS1. The first capacitor electrode CS1 may form a capacitance together with the second capacitor electrode CS2.

The pad PD may be disposed to overlap with the non-display area NDA on the intermediate insulating layer 50. A flexible circuit board on which a driving chip is mounted may be attached to the pad PD. The flexible circuit board may be connected to a main circuit board.

The cover insulating layer 60 may be disposed on the intermediate insulating layer 50. The cover insulating layer 60 may expose top surfaces of the connection electrode CNE and the pad PD. An additional electrode CNE-S may be further included on the connection electrode CNE and the pad PD.

The light control layer OSL may include division partition walls BK and a light control pattern CCF.

Each of the division partition walls BK may have shapes corresponding to the shapes of the non-emission areas in a plan view (e.g., on the plane). Thus, the partition walls BK may not overlap with the emission area PXA, and a space overlapping with the emission area PXA may be provided between the division partition walls BK.

The division partition walls BK may include a black coloring agent to block or substantially block light. The division partition walls BK may include a black dye or a black pigment mixed with a base resin. In an embodiment, a black component may include carbon black, or may include a metal, for example, such as chromium or an oxide thereof.

The light control pattern CCF may be disposed in the space provided between the division partition walls BK. Thus, the light control pattern CCF may overlap with the emission area PXA. Also, the light control pattern CCF may overlap with the openings OP2 and OP3 defined in the color filter layer CFL.

The light control pattern CCF may change an optical property of the source light provided from the light emitting element OLED. The light control pattern CCF may be a color conversion pattern capable of converting source light of blue light into red light or green light depending on the emission area PXA.

The light control pattern CCF may include a base resin and quantum dots mixed (e.g., dispersed) in the base resin. The color conversion patterns of the light control pattern CCF may include different quantum dots for converting the source light into different colored lights.

The base resin may be a medium in which the quantum dots are dispersed. In general, the base resin may include various suitable resin compositions that are called binders. However, the present disclosure is not limited thereto. As used in this specification, a medium capable of dispersing the quantum dots may be referred to as the base resin (e.g., a base resin BR), irrespective of its name, additional other functions, constituent materials, and/or the like.

The base resin may be a polymer resin. For example, the base resin may include an acrylic-based resin, a urethane-based resin, a silicon-based resin, and/or an epoxy-based resin. The base resin may be a transparent resin.

Also, the light control pattern CCF may include (e.g., may be) a transmission pattern that transmits blue light from some of the emission areas PXA. Here, the light control pattern CCF as the transmission pattern may emit the received blue light including scattering particles after scattering. The light control pattern CCF may improve luminance of the emitted light compared to the incident light.

The color conversion pattern may further include scattering particles mixed with the base resin, similar to the above-described transmission pattern. The scattering particles may include (e.g., may be) titanium oxide ($TiO_2$) or silica-based nanoparticles.

The quantum dots may be particles that convert a wavelength of incident light. Each of the quantum dots may be a material having a crystal structure having a size of several nanometers. The quantum dot may be composed of hundreds to thousands of atoms to provide a quantum confinement effect in which an energy band gas increases due to the small size. When light having a wavelength with energy greater than that of the band gap is incident into the quantum dots, the quantum dots may absorb the light, and thus, may be in an excited state to emit light having a suitable or desired wavelength (e.g., a predetermined or specific wavelength), thereby becoming a ground state. The emitted light has a value corresponding to a band gap. When the quantum dots are adjusted in size and composition, light emitting characteristics due to the quantum confinement effect may be adjusted.

The quantum dots may be selected from Group II-VI compounds, Group I-III-VI compounds, Group III-V compounds, Group IV-VI compounds, Group IV elements, Group IV compounds, and/or a combination thereof.

The Group II-VI compounds may be selected from binary element compounds selected from the group consisting of CdSe, CdTe, CdS, ZnS, ZnSe, ZnTe, ZnO, HgS, HgSe, HgTe, MgSe, MgS, and a combination thereof, ternary element compounds selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The I-III-VI group compounds may be selected from ternary compounds selected from the group consisting of AgInS2, CuInS2, AgGaS2, CuGaS2 and mixtures thereof, or quaternary compounds such as AgInGaS2 and CuInGaS2.

The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compounds may further include the Group II metal. For example, InZnP or the like may be selected as the group V compounds.

The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and a combination thereof.

Here, the binary element compounds, the ternary element compounds, and the quaternary element compounds may exist in the particle at a uniform or substantially uniform concentration, or may exist in the particle in a state in which concentration distribution is partitioned into partially different states.

The quantum dots may have a core shell structure including a shell surrounding (e.g., around a periphery of) a core. As another example, the quantum dot may have a core/shell structure in which one quantum dot surrounds (e.g., around a periphery of) another quantum dot. An interface between the core and the shell may have a concentration gradient in which an element existing in the shell has a concentration that gradually decreases toward the core.

Each of the quantum dots may include a particle having a size of a nano scale. The quantum dots may have a full width at half maximum (FWHM) of an emission wavelength spectrum of about 45 nm or less, for example, about 40 nm or less, or about 30 nm or less. In this range, color purity and color reproducibility may be improved. Also, light emitted through the quantum dots may be emitted in various suitable directions (e.g., in all directions) to improve an optical viewing angle.

Also, each of the quantum dots may have any suitable shape, and is not specifically limited to any particular shape. However, in some embodiments, the quantum dot may have a spherical shape, a pyramidal shape, a multi-arm shape, a cubic nanoparticle shape, a nanotube shape, a nanowire shape, a nanofiber shape, a nanoplate particle shape, or the like. The quantum dot may adjust a color of emitted light according to a size thereof. Thus, the quantum dot may emit light having various suitable colors, such as a red color, a green color, and/or a blue color.

The light control pattern CCF may be formed by an inkjet process. After a liquid composition is provided in the space between the division partition walls BK, a volume of the composition polymerized by a thermal curing process or a light curing process may be reduced after the curing. Thus, a stepped portion may occur (e.g., may be formed) between a top surface of the division partition wall BK and a top surface of the light control pattern CCF.

The display element layer DP-OLED may include the light emitting element OLED, a pixel defining layer PDL, and an encapsulation layer TFE.

The light emitting element OLED may include the first electrode AE, a second electrode CE, and an emission layer EML disposed between the first electrode AE and the second electrode CE.

The first electrode AE may cover the division partition wall BK and the light control pattern CCF, and may be connected to the connection electrode CNE. In an embodiment of the present disclosure, the first electrode AE may be a transmissive electrode or a transflective electrode. A material of the first electrode AE is not limited as long as the material is suitable for the transmissive electrode or the transflective electrode.

The emission layer EML may be disposed between the first electrode AE and the second electrode CE to provide the source light to the light control pattern CCF. The emission layer EML may generate blue light. The blue light may include a wavelength of about 410 nm to about 480 nm. An emission spectrum of the blue light may have a peak within a wavelength of about 440 nm to about 460 nm.

The second electrode CE may be disposed on the emission layer EL. The second electrode CE may be a reflective electrode. Accordingly, the second electrode CE may include at least one of Ag, Mg, Cu, Al, Pt, Pd, Au, Ni, Nd, Ir, Cr, Li, Ca, LiF/Ca, LiF/Al, Mo, Ti, or a compound or mixture thereof (e.g., a mixture of Ag and Mg).

In some embodiments, the light emitting element OLED may further include a hole transport region disposed between the first electrode AE and the emission layer EML, and an electron transport region disposed between the emission layer EML and the second electrode CE. The hole transport region may include a hole injection layer and a hole transport layer. The electron transport region may include at least one of a hole stop layer, an electron transport layer, or an electron injection layer, but the present disclosure is not limited thereto.

The pixel defining layer PDL may be disposed on the light control layer OSL. A display opening D-OP may be defined in the pixel defining layer PDL. The display opening D-OP may expose at least a portion of the first electrode AE overlapping with the emission area PXA. Thus, the first electrode AE may be disposed under (e.g., underneath) the pixel defining layer PDL, and the emission layer EML and the second electrode CE may be disposed above the pixel defining layer PDL.

The pixel defining layer PDL may include (e.g., may be) an organic layer. The pixel defining layer PDL may include a general black coloring agent. The pixel defining layer PDL may include a black dye and a black pigment, which are mixed with a base resin. In one embodiment, the black component may include carbon black, or may include a metal, for example, such as chromium or an oxide thereof. However, the present disclosure is not limited thereto, and the pixel defining layer PDL may be colorless.

The encapsulation layer TFE may cover the light emitting element OLED. The encapsulation layer TFE may have a structure in which inorganic layers and an organic layer disposed between the inorganic layers are laminated. The inorganic layers may protect the light emitting element OLED from external moisture, and the organic layer may prevent or substantially prevent the light emitting element OLED form being stabbed, for example, due to foreign substances introduced during a manufacturing process, and may also provide a flat or substantially flat surface on the encapsulation layer TFE when a module or a frame is coupled to the encapsulation layer TFE.

According to the present embodiment, the display panel DP may further include a dam part DMP. The dam part DMP may overlap with the non-display area NDA, and may be disposed on the circuit element layer DP-CL. The dam part DMP controls a spread of the liquid composition, so that the liquid composition may not deviate from a desired area (e.g., a predetermined area) during the process of fabricating the organic layer of the encapsulation layer TFE.

The dam part DMP may include a plurality of layers. For example, the dam part DMP may include a first dam part DM1 disposed on the cover insulating layer 60, and a second dam part DM2 disposed on the first dam part DM1. In an embodiment, the dam part DMP may include the same material as that of at least one of the division partition wall BK or the pixel defining layer PDL. For example, the first dam part DM1 may include the same material as that of the division partition wall BK, and the second dam part DM2 may include the same material as that of the pixel defining layer PDL. However, the present disclosure is not limited thereto, and the dam part DMP may be omitted, or may have a structure in which one layer or three or more layers are laminated, but the present disclosure is not limited to any one embodiment.

Figure 4:
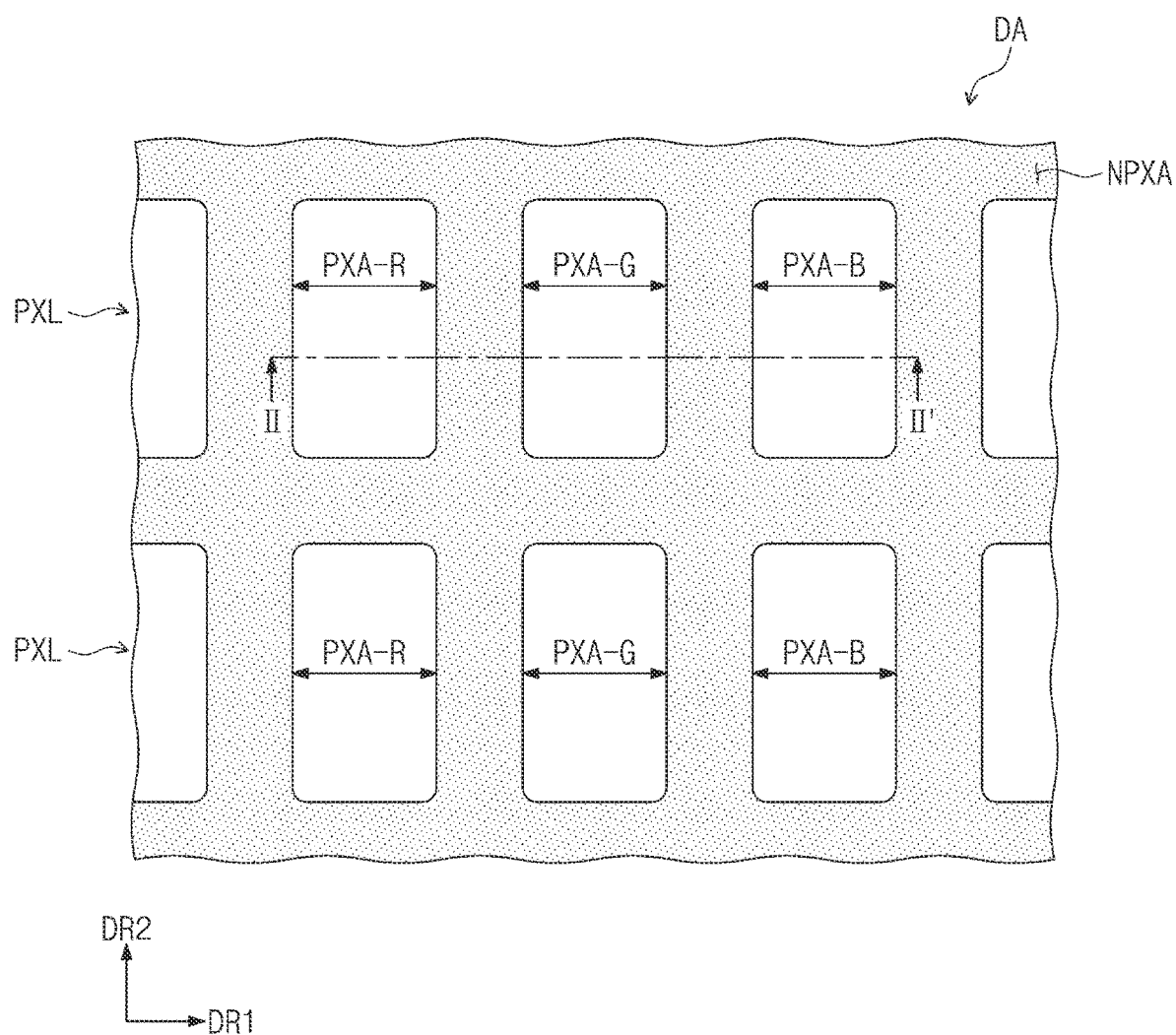
FIG. 4 is a plan view of the display panel according to an embodiment of the present disclosure.
Figure 5:
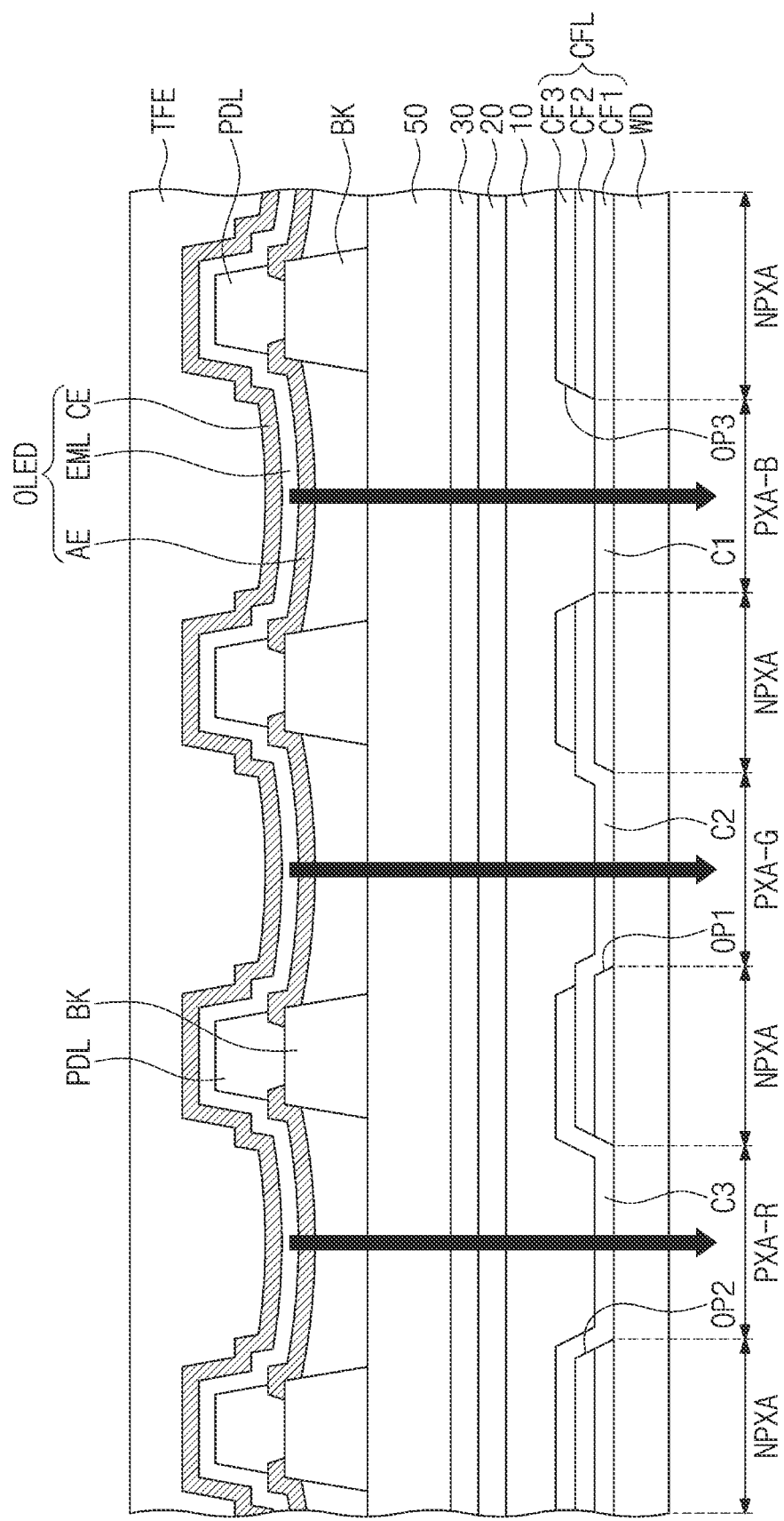
FIG. 5 is a cross-sectional view taken along the line II-II' of FIG. 4.

FIG. 4 is a plan view of the display panel according to an embodiment of the present disclosure. FIG. 5 is a cross-sectional view taken along the line II-II' of FIG. 4. FIG. 4 illustrates six emission areas PXA-R, PXA-G, and PXA-B included in two pixel rows PXL as an example. In FIG. 5, the driving transistor T1 and the capacitor Cst illustrated in FIG. 3 are omitted for convenience of illustration.

In the present embodiment, three kinds of emission areas (e.g., first to third emission areas PXA-R, PXA-G, and PXA-B) as illustrated in FIG. 4 may be repeatedly disposed throughout the display area DA. The non-emission area NPXA is disposed around (e.g., to surround around peripheries of) the first to third emission areas PXA-R, PXA-G, and PXA-B. The non-emission area NPXA may define (e.g., may set) a boundary between the first to third emission areas PXA-R, PXA-G, and PXA-B to prevent or substantially prevent the colors from being mixed with each other between the first to third emission areas PXA-R, PXA-G, and PXA-B.

The division partition wall BK described above with reference to FIG. 3 may have a shape corresponding to the non-emission area NPXA, may not overlap with the first to third emission areas PXA-R, PXA-G, and PXA-B, and may provide an empty space (e.g., empty spaces respectively) overlapping with the first to third emission areas PXA-R, PXA-G, and PXA-B.

Although the first to third emission areas PXA-R, PXA-G, and PXA-B having the same or substantially the same surface area as each other in a plan view (e.g., on the plane) are illustrated in the figures as an example, the present disclosure is not limited thereto. For example, in some embodiments, at least two surface areas of the first to third emission areas PXA-R, PXA-G, and PXA-B may be different from each other.

Although each of the first to third emission areas PXA-R, PXA-G, and PXA-B having a rounded rectangular shape in a plan view (e.g., on the plane) is illustrated in the figures, the present disclosure is not limited thereto. For example, in some embodiments, each of the first to third emission areas PXA-R, PXA-G, and PXA-B may have a different polygonal shape, such as a rhombus shape or a pentagonal shape in a plan view (e.g., on the plane).

One of the first to third emission areas PXA-R, PXA-G, and PXA-B provides a first color light, another provides a second color light different from the first color light, and the remaining one provides a third color light corresponding to the source light that is different from the first color light and the second color light.

In the present embodiment, the first filter layer CF1 may transmit blue light, and may block red light and green light. The second filter layer CF2 may transmit green light, and may block red light and blue light. The third filter layer CF3 may transmit red light, and may block green light and blue light.

In this case, the third emission area PXA-B may provide the third color light corresponding to the source light. In this embodiment, the first emission area PXA-R may provide red light (e.g., the first color light), the second emission area PXA-G may provide green light (e.g., the second color light), and the third emission area PXA-B may provide blue light (e.g., the third color light).

Referring to FIG. 5, the first to third filter layers CF1, CF2, and CF3 of the color filter layer CFL may be disposed at (e.g., in or on) the emission areas corresponding to the first to third emission areas PXA-R, PXA-G, and PXA-B.

For example, first openings OP1 overlapping with the first and second emission areas PXA-R and PXA-G may be defined in the first filter layer CF1. Second openings OP2 overlapping with the first and third emission areas PXA-R and PXA-B may be defined in the second filter layer CF2.

Third openings OP3 overlapping with the second and third emission areas PXA-G and PXA-B may be defined in the third filter layer CF3.

Thus, only a portion C3 of the third filter layer CF3 that transmits the red light may be disposed to be in contact with the window WD at (e.g., in or on) the first emission area PXA-R, and only a portion C2 of the second filter layer CF2 that transmits the green light may be disposed to be in contact with the window WD at (e.g., in or on) the second emission area PXA-G. Also, only a portion C1 of the first filter layer CF1 that transmits the blue light may be in contact the window WD at (e.g., in or on) the third emission area PXA-B.

According to an embodiment of the present disclosure, the first to third filter layers CF1, CF2, and CF3 may be sequentially laminated at (e.g., in or on) the non-emission area NPXA. The first to third filter layers CF1, CF2, and CF3 that are sequentially laminated at (e.g., in or on) the non-emission area NPXA may serve to block or substantially block external light introduced from the window WD. Thus, the conductive patterns disposed on the circuit element layer DP-CL may be prevented or substantially prevented from being reflected by the external light, and thus, may not be visually recognized.

According to the present embodiment, the light control patterns CCF overlapping with the first and second emission areas PXA-R and PXA-G may be color conversion patterns that convert the source light of the blue light provided from the light emitting layer EML into the red light and the green light. Thus, the light control patterns CCF may include quantum dots that are different from each other. Also, the light control pattern CCF overlapping with the third emission area PXA-B may be a transmission pattern.

According to the present embodiment, the first electrodes AE included in the plurality of light emitting elements OLED may be individually patterned and disposed on a corresponding emission area. At least one of the light emitting layer EML or the second electrode CE may be commonly disposed on the plurality of light emitting elements OLED, and provided as one pattern. Although not shown, at least one of a hole control layer that is disposed between the first electrode AE and the emission layer EML, or an electron control layer that is disposed between the emission layer EML and the second electrode CE, may be provided as one pattern, but the present disclosure is not limited to any one embodiment.

According to an embodiment of the present disclosure, because the layer including the transistor T1 (e.g., see FIG. 3) and the light emitting element OLED, which constitute the pixel PX (e.g., see FIG. 1A), the light control layer including the quantum dots, and the color filter layer that selectively transmits light, are disposed (e.g., directly disposed) on the window WD without a separate bonding process, the source light may be prevented or substantially prevented from being lost or mixed by a thickness of the encapsulation layer TFE or a thickness of an adhesion layer used in a separate bonding process. In addition, a slim display panel DP may be provided.

FIG. 6A is a cross-sectional view illustrating a method for fabricating a display panel according to an embodiment of the present disclosure. FIG. 6B is a cross-sectional view illustrating a method for fabricating a display panel according to an embodiment of the present disclosure. FIG. 6C is a cross-sectional view illustrating a method for fabricating a display panel according to an embodiment of the present disclosure. FIG. 6D is a cross-sectional view illustrating a method for fabricating a display panel according to an embodiment of the present disclosure. FIG. 6E is a cross-sectional view illustrating a method for fabricating a display panel according to an embodiment of the present disclosure. FIG. 6F is a cross-sectional view illustrating a method for fabricating a display panel according to an embodiment of the present disclosure.

Figure 7A:
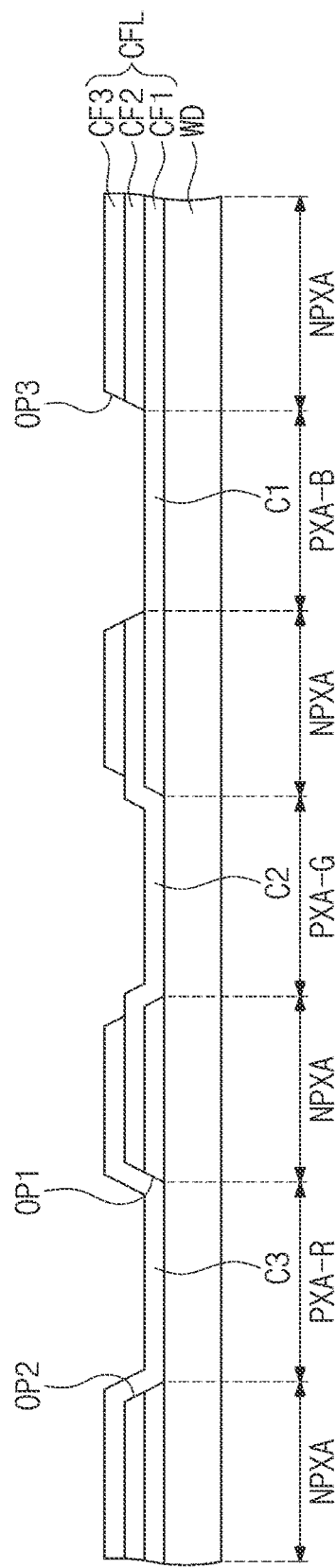
FIG. 7A is a cross-sectional view illustrating a method for fabricating a display panel according to an embodiment of the present disclosure.
Figure 7B:
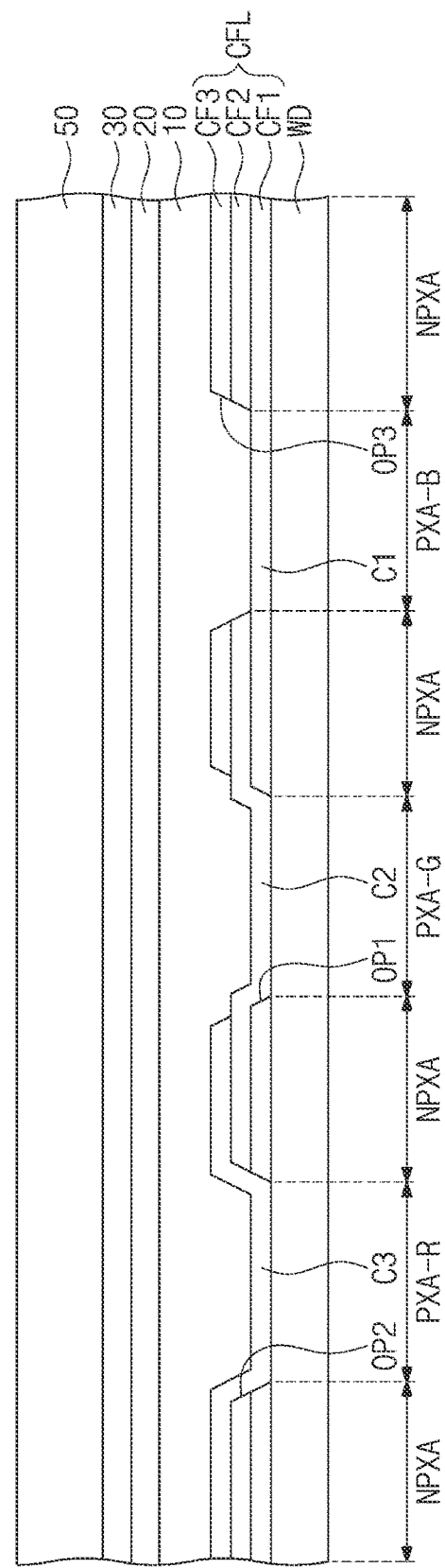
FIG. 7B is a cross-sectional view illustrating a method for fabricating a display panel according to an embodiment of the present disclosure.
Figure 7C:
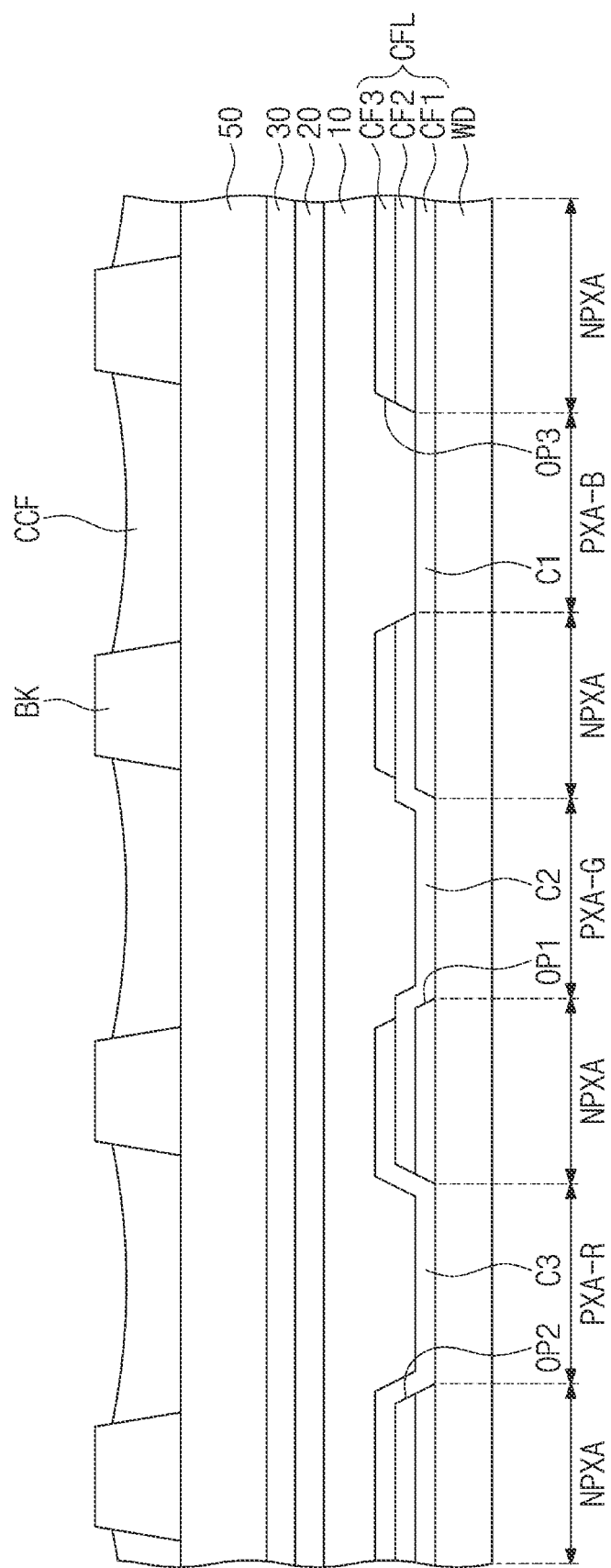
FIG. 7C is a cross-sectional view illustrating a method for fabricating a display panel according to an embodiment of the present disclosure.
Figure 7D:
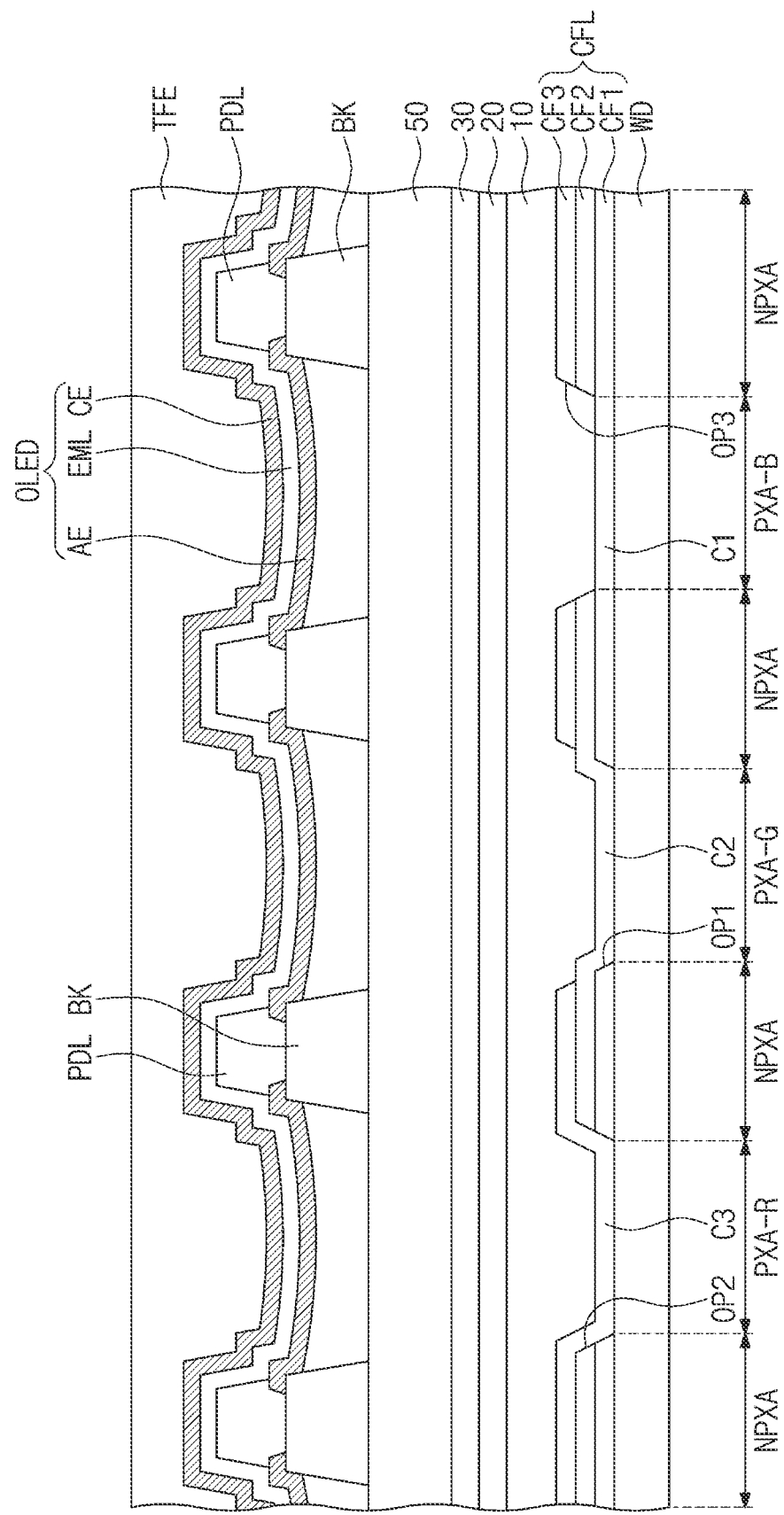
FIG. 7D is a cross-sectional view illustrating a method for fabricating a display panel according to an embodiment of the present disclosure.

FIG. 7A is a cross-sectional view illustrating a method for fabricating a display panel according to an embodiment of the present disclosure. FIG. 7B is a cross-sectional view illustrating a method for fabricating a display panel according to an embodiment of the present disclosure. FIG. 7C is a cross-sectional view illustrating a method for fabricating a display panel according to an embodiment of the present disclosure. FIG. 7D is a cross-sectional view illustrating a method for fabricating a display panel according to an embodiment of the present disclosure.

FIGS. 6A to 6F are cross-sectional views illustrating stages of a method for fabricating the color filter layer CFL formed on the window WD described above with reference to FIGS. 3 and 5, and FIGS. 7A to 7D are cross-sectional view illustrating a method for fabricating other components of the color filter layer CFL described with reference to FIGS. 6A to 6F.

Hereinafter, a method for fabricating a display panel according to an embodiment of the present disclosure will be described with reference to FIGS. 6A to 7D.

Referring to FIGS. 6A and 6B, the method for fabricating the display panel according to an embodiment may include a process of forming an initial first filter layer CF1-A on a window WD. The initial first filter layer CF1-A may be formed to overlap with the first to third emission areas PXA-R, PXA-G, and PXA-B and the non-emission areas NPXA.

The initial first filter layer CF1-A may be formed by applying a base resin and a material including a dye and/or a pigment dispersed in the base resin on the window WD.

Thereafter, the fabricating method may include a process of forming the first filter layer CF1 including the first openings OP1 formed to pass through (e.g., penetrate) the initial first filter layer CF1-A. The first openings OP1 may overlap with the first and second emission areas PXA-R and PXA-G. Thus, the window WD may be exposed from the first filter layer CF1 through the first openings OP1.

Thereafter, referring to FIGS. 6C and 6D, the method for fabricating the display panel according to an embodiment may include a process of forming an initial second filter layer CF2-A on the first filter layer CF1. The initial second filter layer CF2-A may be formed to overlap with the first to third emission areas PXA-R, PXA-G, and PXA-B and the non-emission areas NPXA.

The initial second filter layer CF2-A may be formed by applying a base resin and a material including a dye and/or a pigment dispersed in the base resin on the window WD.

Thereafter, the fabricating method may include a process of forming the second filter layer CF2 including the second openings OP2 formed to pass through (e.g., penetrate) the initial second filter layer CF2-A. The second openings OP2 may overlap with the first and third emission areas PXA-R and PXA-B. Thus, the window WD overlapping with the first emission area PXA-R may be exposed from the second filter layer CF2 by one of the second openings OP2. Also, the first filter layer CF1 overlapping with the third emission area PXA-B may be exposed from the second filter layer CF2 through the other second opening OP2.

Thereafter, referring to FIGS. 6E and 6F, the method for fabricating the display panel according to an embodiment may include a process of forming an initial third filter layer CF3-A on the second filter layer CF2. The initial third filter layer CF3-A may be formed to overlap with the first to third emission areas PXA-R, PXA-G, and PXA-B and the non-emission areas NPXA.

The initial third filter layer CF3-A may be formed by applying a base resin and a material including a dye and/or a pigment dispersed in the base resin on the window WD.

Thereafter, the fabricating method may include a process of forming the third filter layer CF3 including the third openings OP3 formed to pass through (e.g., penetrate) the initial third filter layer CF3-A. The third openings OP3 may overlap with the second and third emission areas PXA-G and PXA-B. Thus, the second filter layer CF2 overlapping with the second emission areas PXA-G may be exposed from the third filter layer CF3 through one of the third openings OP3. Also, the first filter layer CF1 overlapping with the third emission area PXA-B may be exposed from the third filter layer CF3 through the other third opening OP3.

The color filter layer CFL illustrated in FIG. 7A may be the same or substantially the same as the color filter layer CFL illustrated in FIGS. 6A to 6F.

Referring to FIG. 7B, a method of fabricating a display panel according to an embodiment may include forming a plurality of insulating layers 10, 20, 30, and 50 on the color filter layer CFL. According to an embodiment of the present disclosure, the plurality of insulating layers 10, 20, 30, and 50 formed on the color filter layer CFL may be formed on the color filter layer CFL through a continuous process without a separate bonding process.

Among the insulating layers shown in FIG. 3, the intervening insulating interlayer 40 and the cover insulating layer 60 are omitted in FIGS. 7B through 7D.

A process of forming the insulating layers 10, 20, 30, and 50 may include a process of forming a plurality of conductive patterns that are disposed between the insulating layers 10, 20, 30, and 50. The conductive patterns may include a process of forming the transistors T1 to T3, the capacitor Cst, and the light blocking pattern BML, which are described above with reference to FIG. 2. The circuit element layer DP-CL (e.g., see FIG. 3) may be formed through a process of forming an insulating layer, a semiconductor layer, and a conductive layer on the color filter layer CFL by coating or deposition, and a process of patterning the insulating layer, the semiconductor layer, and the conductive layer by a photolithography process.

Thereafter, referring to FIG. 7C, a method for fabricating a display panel according to an embodiment may include a process of forming the division partition walls BK and the light control pattern CCF. Each of the division partition walls BK may be formed by applying a dye and/or a pigment mixed with a base resin on an uppermost insulating layer 50, and then patterning the resultant structure. The division partition wall BK may be patterned to overlap with the non-emission areas NPXA.

The light control pattern CCF may be formed by an inkjet process. After a liquid composition is applied between the corresponding division partition walls BK, the liquid composition may be cured by a thermal curing process or a light curing process. Here, a volume of the polymerized composition is reduced, and thus, a stepped portion may occur between a top surface of the division partition wall BK and the light control pattern CCF.

Thereafter, referring to FIG. 7D, a method of fabricating a display panel according to an embodiment may include a process of forming a light emitting element OLED.

A first electrode AE may be patterned to overlap with corresponding first to third emission areas PXA-R, PXA-G, and PXA-B after applying a transflective or transmissive material on the division partition wall BK and the light control pattern CCF. Thus, the first electrodes AE included in each light emitting element OLED may be spaced apart from each other.

A pixel defining layer PDL may be formed on the first electrode AE. The pixel defining layer PDL may form a display opening by applying an organic material and then removing a portion thereof overlapping with the first electrode AE.

Thereafter, the fabricating method may include a process of forming an emission layer EML and a second electrode CE on the pixel defining layer PDL. The light emitting layer EML included in each light emitting element OLED may be formed as one pattern to provide the same source light to the first to third emission areas PXA-R, PXA-G, and PXA-B. The second electrode CE may also be formed as one pattern on the emission layer EML. The second electrode CE may be formed by applying a reflective material. Thereafter, the fabricating method may further include a process of forming the encapsulation layer TFE to cover the light emitting element OLED.

The method for fabricating the display panel according to an embodiment of the present disclosure includes a process of forming a color filter layer CFL, a circuit element layer DP-CL (e.g., see FIG. 3), a light control layer OSL (e.g., see FIG. 3), and a display element layer DP-OLED on the window WD through a continuous process without a separate bonding process. Thus, misalignment that may occur in a process of bonding separate substrates may be prevented or substantially prevented, and a slim display panel DP may be provided.

According to one or more embodiments of the present disclosure, the color filter layer that selectively transmits light, the layer constituting the pixel, and the light control layer including the quantum dots may be sequentially laminated on the window without a separate bonding process to prevent or substantially prevent the source light from being lost or mixed by a thickness of the encapsulation layer or a thickness of an adhesive layer used in the separate bonding process. In addition, a slim display panel may be provided.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:
a window including a display area, and a non-display area adjacent to the display area;
a color filter layer on the window;
a circuit element layer comprising:
a low refractive index layer covering the color filter layer; and
a transistor on the low refractive index layer;
a light control layer comprising:
division partition walls on the circuit element layer; and
a light control pattern between the division partition walls, and comprising quantum dots; and
a display element layer on the light control layer, and comprising:
a first electrode;
a second electrode on the first electrode; and
an emission layer between the first electrode and the second electrode and configured to generate light,
wherein the light passes through the light control layer, the circuit element layer, and the color filter layer to be transmitted to the window.

2. The display panel of claim 1, wherein a thickness of the low refractive index layer at an area overlapping with the light control pattern is greater than a thickness of the low refractive index layer at other areas.

3. The display panel of claim 1, wherein the transistor comprises:
a semiconductor pattern comprising a source, an active, and a drain; and
a gate overlapping with the active, and
wherein the semiconductor pattern does not overlap with the light control pattern.

4. The display panel of claim 3, wherein the circuit element layer comprises:
a passivation layer on the low refractive index layer;
a light blocking pattern on the passivation layer;
a buffer layer configured to cover the light blocking pattern, and on which the semiconductor pattern is located;
an intervening insulating layer between the active and the gate;
an intermediate insulating layer configured to cover the gate and the buffer layer;
a connection electrode on the intermediate insulating layer to connect the source to the first electrode; and
a cover insulating layer configured to cover the connection electrode.

5. The display panel of claim 4, wherein the light blocking pattern overlaps with at least a portion of the semiconductor pattern, and is spaced from the light control pattern.

6. The display panel of claim 4, wherein the connection electrode passes through the buffer layer to be connected to the light blocking pattern.

7. The display panel of claim 4, wherein the circuit element layer comprises a capacitor comprising:
a first capacitor electrode on the intervening insulating layer; and
a second capacitor electrode overlapping with the first capacitor electrode on the intervening insulating layer.

8. The display panel of claim 4, further comprising a pad on the intermediate insulating layer at the non-display area, and exposed by the cover insulating layer,
wherein the pad comprises a same material as that of the connection electrode.

9. The display panel of claim 1, wherein the display element layer comprises a pixel defining layer having a display opening overlapping with the light control pattern.

10. The display panel of claim 9, further comprising a dam part on the circuit element layer at the non-display area,
wherein the dam part comprises a same material as that of at least one of the division partition walls or the pixel defining layer.

11. The display panel of claim 1, wherein the display element layer further comprises an encapsulation layer configured to cover a light emitting element.

12. The display panel of claim 1, wherein the emission layer is configured to generate blue light.

13. The display panel of claim 1, wherein the display panel is curved along an axis extending in one direction.

14. A display panel comprising:
a window including emission areas, and non-emission areas adjacent to the emission areas;
a color filter layer on the window, and comprising first to third filter layers configured to transmit different color light from each other;
transistors on the color filter layer;
a light control layer overlapping with corresponding ones of the first to third filter layers, and comprising first to third light control patterns, at least one of the first to third light control patterns comprising quantum dots; and
light emitting elements connected to corresponding ones of the transistors, and configured to generate light,
wherein, a corresponding one of the first to third filter layers is located on the window to overlap with a corresponding one of the emission areas, and each of the first to third filter layers are located on the window to overlap with the non-emission areas; wherein the first to third filter layers are sequentially laminated on the window, and wherein the first filter layer is configured to transmit blue light, the second filter layer is configured to transmit green light, and the third filter layer is configured to transmit red light; wherein the light passes through the light control layer and the color filter layer to be transmitted to the window.

15. The display panel of claim 14, further comprising a low refractive index layer configured to cover the color filter layer,
wherein the transistors are spaced from the first to third filter layers with the low refractive index layer therebetween.

16. The display panel of claim 15, wherein a thickness of the low refractive index layer at each area overlapping with the emission areas is greater than a thickness of the low refractive index layer at each area overlapping with the non-emission areas.

17. The display panel of claim 14, further comprising division partition walls configured to partition the first to third light control patterns from each other,
wherein the division partition walls overlap with the non-emission areas.

18. The display panel of claim 14, wherein each of the light emitting elements comprises a first electrode, a second electrode, and an emission layer between the first electrode and the second electrode, and
wherein at least one of the emission layer or the second electrode is included in each of the light emitting elements as one pattern connected to each other.

19. The display panel of claim 14, wherein the light generated from the light emitting elements comprise blue light.

\* \* \* \* \*